(12) United States Patent
Khayat et al.

(10) Patent No.: US 11,740,970 B2
(45) Date of Patent: Aug. 29, 2023

(54) DYNAMIC ADJUSTMENT OF DATA INTEGRITY OPERATIONS OF A MEMORY SYSTEM BASED ON ERROR RATE CLASSIFICATION

(71) Applicant: Micron Technology, Inc., Boise, ID (US)

(72) Inventors: Patrick Robert Khayat, San Diego, CA (US); James Fitzpatrick, Laguna Niguel, CA (US); AbdelHakim S. Alhussien, San Jose, CA (US); Sivagnanam Parthasarathy, Carlsbad, CA (US)

(73) Assignee: Micron Technology, Inc., Boise, ID (US)

( * ) Notice: Subject to any disclaimer, the term of this patent is extended or adjusted under 35 U.S.C. 154(b) by 484 days.

(21) Appl. No.: 16/807,056

(22) Filed: Mar. 2, 2020

(65) Prior Publication Data
US 2021/0271549 A1 Sep. 2, 2021

(51) Int. Cl.
*G06F 11/00* (2006.01)
*G06F 11/10* (2006.01)
(Continued)

(52) U.S. Cl.
CPC .......... *G06F 11/1076* (2013.01); *G06N 5/04* (2013.01); *G06N 20/00* (2019.01); *G11C 16/26* (2013.01);
(Continued)

(58) Field of Classification Search
CPC ............ G06F 11/1076; G06F 11/1012; G06F 11/1044; G06N 5/04; G06N 20/00;
(Continued)

(56) References Cited

U.S. PATENT DOCUMENTS 5,864,504 A 1/1999 Tanzawa et al.
7,117,231 B2 10/2006 Fischer et al.
(Continued)

OTHER PUBLICATIONS

Data Programming Techniques to Store Multiple Bits of Data Per Memory Cell with High Reliability, U.S. Appl. No. 17/124,380, filed Dec. 16, 2020, Phong Nguyen et al., Application Dispatched from Preexam, Not Yet Docketed, Jan. 19, 2021.
(Continued)

*Primary Examiner* — Albert Decady
*Assistant Examiner* — Osman M Alshack
(74) *Attorney, Agent, or Firm* — Greenberg Traurig

(57) ABSTRACT

A memory sub-system configured to dynamically select an option to process encoded data retrieved from memory cells of a memory component, based on a prediction generated using signal and noise characteristics of memory cells storing the encoded data. For example, the memory component is enclosed in an integrated circuit and has a calibration circuit. The signal and noise characteristics are measured by the calibration circuit as a byproduct of executing a read command in the memory component to retrieve the encoded data. A data integrity classifier configured in the memory sub-system generates a prediction based on the signal and noise characteristics. Based on the prediction, the memory sub-system selects an option from a plurality of options configured in the memory sub-system to process the encoded data.

25 Claims, 6 Drawing Sheets

(51) Int. Cl.
*G06N 5/04* (2023.01)
*H03M 13/11* (2006.01)
*G11C 16/26* (2006.01)
*G06N 20/00* (2019.01)
*G11C 16/04* (2006.01)

(52) U.S. Cl.
CPC ..... *H03M 13/1102* (2013.01); *G11C 16/0483* (2013.01)

(58) Field of Classification Search
CPC .............. H03M 13/1102; H03M 13/13; G11C 16/0483; G11C 2029/0409; G11C 11/5642; G11C 29/021; G11C 29/028; G11C 29/20; G11C 29/42; G11C 29/4401; G11C 29/52
USPC .................................................. 714/763, 764
See application file for complete search history.

(56) References Cited

U.S. PATENT DOCUMENTS

| | | | |
|---|---|---|---|
| 9,129,698 | B2 | 9/2015 | Zeng et al. |
| 9,385,896 | B1* | 7/2016 | Mitra ................ H04L 25/03203 |
| 9,947,401 | B1 | 4/2018 | Navon et al. |
| 10,008,273 | B2 | 6/2018 | Ray et al. |
| 10,347,344 | B2 | 7/2019 | Malshe et al. |
| 11,029,890 | B1 | 6/2021 | Parthasarathy et al. |
| 11,081,200 | B1 | 8/2021 | Parthasarathy et al. |
| 11,086,572 | B1 | 8/2021 | Alhussien et al. |
| 11,221,800 | B2 | 1/2022 | Fitzpatrick et al. |
| 11,237,726 | B2 | 2/2022 | Fitzpatrick et al. |
| 11,257,546 | B2 | 2/2022 | Fitzpatrick et al. |
| 11,264,103 | B2 | 3/2022 | Papandreou et al. |
| 11,341,410 | B1 | 5/2022 | Johnson et al. |
| 11,403,042 | B2 | 8/2022 | Mhussien et al. |
| 11,474,748 | B2 | 10/2022 | Parthasarathy et al. |
| 11,562,793 | B2 | 1/2023 | Parthasarathy et al. |
| 2006/0166675 | A1 | 7/2006 | Yoon |
| 2008/0002468 | A1 | 1/2008 | Hemink |
| 2008/0056008 | A1 | 3/2008 | Aritome et al. |
| 2008/0192544 | A1 | 8/2008 | Berman et al. |
| 2009/0063507 | A1 | 3/2009 | Thompson |
| 2009/0144582 | A1 | 6/2009 | Li et al. |
| 2009/0228701 | A1 | 9/2009 | Lin |
| 2009/0241008 | A1 | 9/2009 | Kim et al. |
| 2010/0027337 | A1 | 2/2010 | Park |
| 2011/0066915 | A1* | 3/2011 | Arye ..................... H04L 1/0017 714/752 |
| 2011/0221514 | A1 | 9/2011 | Pan |
| 2011/0280084 | A1 | 11/2011 | Radke et al. |
| 2012/0198129 | A1 | 8/2012 | Van Aken et al. |
| 2012/0246395 | A1 | 9/2012 | Cho et al. |
| 2013/0007343 | A1 | 1/2013 | Rub et al. |
| 2013/0070524 | A1 | 3/2013 | Dutta et al. |
| 2013/0094289 | A1 | 4/2013 | Sridharan et al. |
| 2013/0151753 | A1 | 6/2013 | Jeon et al. |
| 2014/0022853 | A1 | 1/2014 | Choi et al. |
| 2014/0068384 | A1 | 3/2014 | Kwak et al. |
| 2014/0071761 | A1 | 3/2014 | Sharon et al. |
| 2014/0204671 | A1 | 7/2014 | Sharon et al. |
| 2014/0269057 | A1 | 9/2014 | Shereshevski et al. |
| 2015/0124533 | A1 | 5/2015 | Zeng et al. |
| 2015/0171957 | A1* | 6/2015 | Featherston ........... H04B 10/11 398/38 |
| 2016/0049203 | A1 | 2/2016 | Mrod et al. |
| 2016/0094247 | A1* | 3/2016 | Parthasarathy ... H03M 13/2927 714/755 |
| 2016/0187961 | A1 | 6/2016 | Elibol et al. |
| 2016/0300609 | A1 | 10/2016 | Han et al. |
| 2017/0061832 | A1 | 3/2017 | Ghosh et al. |
| 2018/0144786 | A1* | 5/2018 | Lim .................... G06F 11/1068 |
| 2018/0240515 | A1 | 8/2018 | Shibata et al. |
| 2018/0253353 | A1* | 9/2018 | Takase .............. H03M 13/2906 |
| 2018/0254888 | A1 | 9/2018 | Monahan et al. |
| 2018/0330098 | A1 | 11/2018 | Wyseur |
| 2018/0373598 | A1 | 12/2018 | Mondello et al. |
| 2019/0034123 | A1 | 1/2019 | Dhuse et al. |
| 2019/0043590 | A1* | 2/2019 | Besinga ................ G11C 29/00 |
| 2019/0130967 | A1 | 5/2019 | Danjean et al. |
| 2019/0130982 | A1 | 5/2019 | Reusswig et al. |
| 2019/0189228 | A1 | 6/2019 | Lin et al. |
| 2019/0318228 | A1 | 10/2019 | Kim et al. |
| 2019/0318791 | A1 | 10/2019 | Lin et al. |
| 2019/0347015 | A1 | 11/2019 | Luo et al. |
| 2019/0361769 | A1 | 11/2019 | Chan et al. |
| 2019/0362783 | A1 | 11/2019 | Tokutomi et al. |
| 2019/0379404 | A1* | 12/2019 | Blankenship ......... H04L 1/0061 |
| 2020/0021358 | A1* | 1/2020 | Maccaglia ........... H04B 10/038 |
| 2020/0051621 | A1 | 2/2020 | Papandreou et al. |
| 2020/0118620 | A1 | 4/2020 | Bazarsky et al. |
| 2020/0125097 | A1 | 4/2020 | Juliato et al. |
| 2020/0201608 | A1 | 6/2020 | Wallbaum et al. |
| 2020/0241758 | A1 | 7/2020 | Patel et al. |
| 2020/0273840 | A1 | 8/2020 | Elsherbini et al. |
| 2020/0293398 | A1* | 9/2020 | Symons ............... G06F 11/1068 |
| 2020/0302318 | A1 | 9/2020 | Hetherington et al. |
| 2020/0303000 | A1 | 9/2020 | Takahashi et al. |
| 2020/0401316 | A1 | 12/2020 | Hankins et al. |
| 2021/0152191 | A1* | 5/2021 | Sarkis .................... H03M 13/09 |
| 2021/0158861 | A1 | 5/2021 | Jeong et al. |
| 2021/0181942 | A1* | 6/2021 | Fitzpatrick ........... G11C 29/028 |
| 2021/0182166 | A1 | 6/2021 | Hahn et al. |
| 2021/0271415 | A1 | 9/2021 | Fitzpatrick et al. |
| 2021/0271416 | A1 | 9/2021 | Alhussien et al. |
| 2021/0271422 | A1 | 9/2021 | Parthasarathy et al. |
| 2021/0273650 | A1 | 9/2021 | Parthasarathy et al. |
| 2021/0311668 | A1 | 10/2021 | Alhussien et al. |
| 2021/0350856 | A1 | 11/2021 | Fitzpatrick et al. |
| 2021/0350857 | A1 | 11/2021 | Parthasarathy et al. |
| 2021/0350869 | A1 | 11/2021 | Parthasarathy et al. |
| 2022/0083277 | A1 | 3/2022 | Fitzpatrick et al. |
| 2022/0084603 | A1 | 3/2022 | Khayat et al. |
| 2022/0107731 | A1 | 4/2022 | Fitzpatrick et al. |
| 2022/0139468 | A1 | 5/2022 | Fitzpatrick et al. |
| 2022/0189544 | A1 | 6/2022 | Nguyen et al. |
| 2022/0317937 | A1 | 10/2022 | Alhussien et al. |
| 2023/0004328 | A1 | 1/2023 | Parthasarathy et al. |
| 2023/0012648 | A1 | 1/2023 | Fitzpatrick et al. |

OTHER PUBLICATIONS

Memory System Performance Enhancements using Measured Signal and Noise Characteristics of Memory Cells, U.S. Appl. No. 16/714,463, filed Dec. 13, 2019, James Fitzpatrick et al., Final Rejection, dated Jun. 2, 2021.

Improved Reading of Soft Bits and Hard Bits From Memory Cells, U.S. Appl. No. 16/869,488, filed May 7, 2020, James Fitzpatrick et al., Docketed New Case—Ready for Examination, May 29, 2020.

Read Soft Bits Through Boosted Modulation Following Reading Hard Bits, U.S. Appl. No. 16/869,492, filed May 7, 2020, Sivagnanam Parthasarathy et al., Docketed New Case—Ready for Examination, May 27, 2020.

Intelligent Proactive Responses to Operations to Read Data From Memory Cells, U.S. Appl. No. 16/869,494, filed May 7, 2020, Sivagnanam Parthasarathy et al., Awaiting TC Resp, Issue Fee Payment Verified, Jun. 17, 2021.

Intelligent Proactive Responses to Operations to Read Data from Memory Cells, U.S. Appl. No. 17/346,125, filed Jun. 11, 2021, Sivagnanam Parthasarathy et al., Application Undergoing Preexam Processing, Jun. 11, 2021.

Adaptive and/or Iterative Operations in Executing a Read Command to Retrieve Data From Memory Cells, U.S. Appl. No. 16/807,059, filed Mar. 2, 2020, James Fitzpatrick et al., Non Final Action, dated Apr. 26, 2021.

Self Adapting Iterative Read Calibration to Retrieve Data From Memory Cells, U.S. Appl. No. 16/807,061, filed Mar. 2, 2020, Abdelhakim Alhussien et al., Notice of Allowance Mailed—Application Received in Office of Publications, dated Nov. 13, 2020.

(56) References Cited

OTHER PUBLICATIONS

Self Adapting Iterative Read Calibration to Retrieve Data from Memory Cells, U.S. Appl. No. 17/350,425, filed Jun. 17, 2021, Abdelhakim Alhussien et al., Application Undergoing Preexam Processing, Jun. 17, 2021.
Compound Feature Generation in Classification of Error Rate of Data Retrieved From Memory Cells, U.S. Appl. No. 16/807,063, filed Mar. 2, 2020, Sivagnanam Parthasarathy et al., Publications—Issue Fee Payment Verified, May 3, 2021.
Compound Feature Generation in Classification of Error Rate of Data Retrieved from Memory Cells, U.S. Appl. No. 17/313,944, filed May 6, 2021, Sivagnanam Parthasarathy et al. Application Dispatched from Preexam, Not Yet Docketed, May 14, 2021.
Classification of Error Rate of Data Retrieved From Memory Cells, U.S. Appl. No. 16/807,065, filed Mar. 2, 2020, Sivagnanam Parthasarathy et al. Docketed New Case—Ready for Examination, Mar. 30, 2020.
Data Programming Techniques to Store Multiple Bots of Data Per Memory Cell with High Reliability, U.S. Appl. No. 17/124,380, filed Dec. 16, 2020, Phuong Nguyen et al., Docketed New Case—Ready for Examination, Aug. 21, 2021.
Memory System Performance Enhancements using Measured Signal and Noise Characteristics of Memory Cells, U.S. Appl. No. 16/714,463, filed Dec. 13, 2019, James Fitzpatrick et al., Notice of Allowance Mailed—Application Received in Office of Publications, dated Jun. 2, 2021.
Improved Reading of Soft Bits and Hard Bits From Memory Cells, U.S. Appl. No. 16/869,488, filed May 7, 2020, James Fitzpatrick et al., Non Final Action, dated Jul. 7, 2021.
Intelligent Proactive Responses to Operations to Read Data From Memory Cells, U.S. Appl. No. 16/869,494, filed May 7, 2020, Sivagnanam Parthasarathy et al., Patented Case, Jul. 14, 2021.
Intelligent Proactive Responses to Operations to Read Data from Memory Cells, U.S. Appl. No. 17/346,125, filed Jun. 11, 2021, Sivagnanam Parthasarathy et al., Docketed New Case—Ready for Examination, Aug. 23, 2021.
Adaptive and/or Iterative Operations in Executing a Read Command to Retrieve Data From Memory Cells, U.S. Appl. No. 16/807,059, filed Mar. 2, 2020, James Fitzpatrick et al. Notice of Allowance Mailed—Application Received in Office of Publications, dated Apr. 26, 2021.
Adaptive and/or Iterative Operations in Executing a Read Command to Retrieve Data from Memory Cells, U.S. Appl. No. 17/534,850, filed Nov. 24, 2021, James Fitzpatrick et al., Application Undergoing Preexam Processing, Nov. 24, 2021.
Self Adapting Iterative Read Calibration to Retrieve Data From Memory Cells, U.S. Appl. No. 16/807,061, filed Mar. 2, 2020, Abdelhakim Alhussien et al., Patented Case, Nov. 13, 2020.
Self Adapting Iterative Read Calibration to Retrieve Data from Memory Cells, U.S. Appl. No. 17/350,425, filed Jun. 17, 2021, Abdelhakim Alhussien et al., Docketed New Case—Ready for Examination, Aug. 24, 2021.
Compound Feature Generation in Classification of Error Rate of Data Retrieved from Memory Cells, U.S. Appl. No. 16/807,063, filed Mar. 2, 2020, Sivagnanam Parthasarathy et al., Patented Case, May 19, 2021.
Compound Feature Generation in Classification of Error Rate of Data Retrieved from Memory Cells, U.S. Appl. No. 17/313,944, filed May 6, 2021, Sivagnanam Parthasarathy et al., Docketed New Case—Ready for Examination, Aug. 23, 2021.
Classification of Error Rate of Data Retrieved From Memory Cells, U.S. Appl. No. 16/807,065, filed Mar. 2, 2020, Sivagnanam Parthasarathy et al., Docketed New Case—Ready for, Mar. 30, 2020.
International Search Report and Written Opinion, PCT/US2020/063788, dated Mar. 26, 2021.
Data Programming Techniques to Store Multiple Bits of Data Per Memory Cell with High Reliability, U.S. Appl. No. 17/124,380, filed Dec. 16, 2020, Phong Nguyen et al., Docketed New Case—Ready for Examination, Aug. 21, 2021.
Memory System Performance Enhancements using Measured Signal and Noise Characteristics of Memory Cells, U.S. Appl. No. 16/714,463, filed Dec. 13, 2019, James Fitzpatrick et al., Patented Case, Jun. 2, 2021.
Memory System Performance Enhancements using Measured Signal and Noise Characteristics of Memory Cells, U.S. Appl. No. 17/552,179, filed Dec. 15, 2021, James Fitzpatrick et al., Docketed New Case—Ready for Examination, Dec. 29, 2021.
Improved Reading of Soft Bits and Hard Bits From Memory Cells, U.S. Appl. No. 16/869,488, filed May 7, 2020, James Fitzpatrick et al., Notice of Allowance Mailed—Application Received in Office of Publications, dated Jul. 7, 2021.
Improved Reading of Soft Bits and Hard Bits from Memory Cells, U.S. Appl. No. 17/577,716, filed Jan. 18, 2022, James Fitzpatrick et al., Application Undergoing Preexam Processing, Jan. 18, 2022.
Read Soft Bits Through Boosted Modulation Following Reading Hard Bits, U.S. Appl. No. 16/869,492, filed May 7, 2020, Sivagnanam Pathasarathy et al., Docketed New Case—Ready for Examination, May 27, 2020.
Adaptive and/or Iterative Operations in Executing a Read Command to Retrieve Data From Memory Cells, U.S. Appl. No. 16/807,059, filed Mar. 2, 2020, James Fitzpatrick et al., Patented Case, Apr. 26, 2021.
Adaptive and/or Iterative Operations in Executing a Read Command to Retrieve Data from Memory Cells, U.S. Appl. No. 17/534,850, filed Nov. 24, 2021, James Fitzpatrick et al., Docketed New Case—Ready for Examination, Dec. 8, 2021.
Classification of Error Rate of Data Retrieved From Memory Cells, U.S. Appl. No. 16/807,065, filed Mar. 2, 2002, Sivagnanam Parthasarathy et al., Docketed New Case—Ready for Examination, Mar. 30, 2020.
Tingjun Xie, et al. "Polar Codes for NAND-Based SSD Systems: A Joint Source Channel Coding Perspective." IEEE, 2017.
International Search Report and Written Opinion, PCT/US2022/036372, dated Oct. 28, 2022.

* cited by examiner

DYNAMIC ADJUSTMENT OF DATA INTEGRITY OPERATIONS OF A MEMORY SYSTEM BASED ON ERROR RATE CLASSIFICATION

FIELD OF THE TECHNOLOGY

At least some embodiments disclosed herein relate to memory systems in general, and more particularly, but not limited to memory systems having dynamic adjustment of data integrity operations based on Error Rate Classification.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
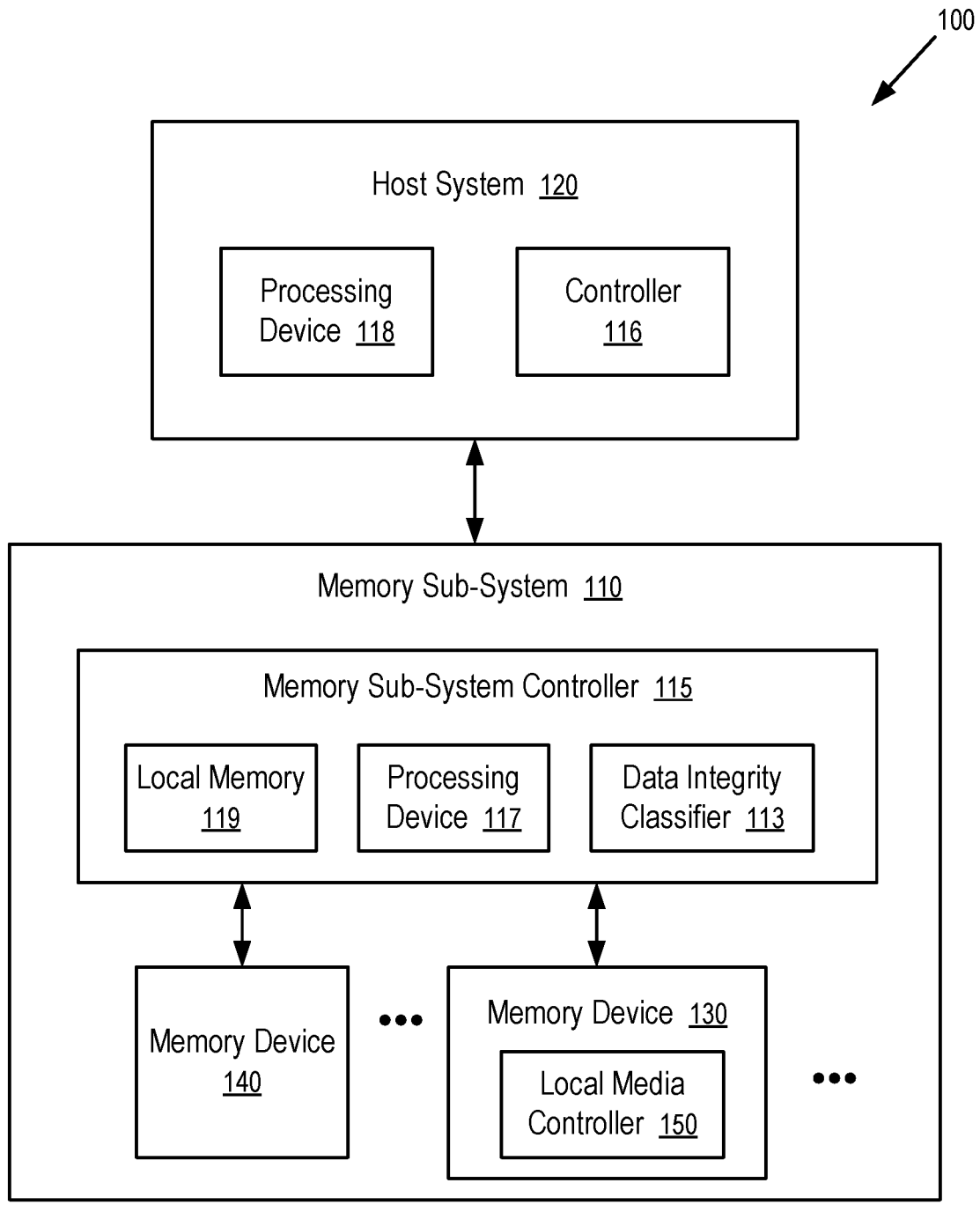
FIG. 1 illustrates an example computing system having a memory sub-system in accordance with some embodiments of the present disclosure.

At least some aspects of the present disclosure are directed to a memory sub-system having a data integrity classifier configured to determine an error rate classification of data retrieved from memory cells, which allows the memory sub-system to dynamically adjust error detection and recovery operations based on the error rate classification. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

An integrated circuit memory cell (e.g., a flash memory cell) can be programmed to store data by the way of its state at a threshold voltage. For example, if the memory cell is configured/programmed in a state that allows a substantial current to pass the memory cell at the threshold voltage, the memory cell is storing a bit of one; and otherwise, the memory cell is storing a bit of zero. Further, a memory cell can store multiple bits of data by being configured/programmed differently at multiple threshold voltages. For example, the memory cell can store multiple bits of data by having a combination of states at the multiple threshold voltages; and different combinations of the states of the memory cell at the threshold voltages can be interpreted to represent different states of bits of data that is stored in the memory cell.

However, after the states of integrated circuit memory cells are configured/programmed using write operations to store data in the memory cells, the optimized threshold voltage for reading the memory cells can shift due to a number of factors, such as charge loss, read disturb, cross-temperature effect (e.g., write and read at different operating temperatures), etc., especially when a memory cell is programmed to store multiple bits of data.

Data can be encoded with redundancy information to facilitate error detection and recovery. When data encoded with redundancy information is stored in a memory sub-system, the memory sub-system can detect errors in raw, encoded data retrieved from the memory sub-system and/or recover the original, non-encoded data that is used to generated encoded data for storing in the memory sub-system. The recovery operation can be successful (or have a high probability of success) when the raw, encoded data retrieved from the memory sub-system contains less than a threshold amount of errors, or the bit error rate in the encoded data is lower than a threshold. For example, error detection and data recovery can be performed using techniques such as Error Correction Code (ECC), Low-Density Parity-Check (LDPC) code, etc.

Some error detection and data recovery operations can be successful in identifying error-free results with the encoded data having a relatively large amount of errors at the cost of a relatively large amount of power consumption and/or a relatively long computing time. Other error detection and data recovery operations can recover a relatively small amount of errors with less power consumption and/or a short computing time.

Conventional calibration circuitry has been used to self-calibrate a memory region in applying read level signals to account for shift of threshold voltages of memory cells within the memory region. During the calibration, the calibration circuitry is configured to apply different test signals to the memory region to count the numbers of memory cells that output a specified data state for the test signals. Based on the counts, the calibration circuitry determines a read level offset value as a response to a calibration command.

At least some aspects of the present disclosure address the above and other deficiencies by dynamically configuring error detection and data recovery operations based on a data integrity classification, or a bit error rate classification, generated from signal and noise characteristics measured by a memory device for memory cells in the memory device.

For example, a predictive model can be generated through machine learning to classify or predict the error rate in the raw data received from a set of memory cells. The classification can be generated by the predictive model based on signal and noise characteristics measured by the memory device during the reading of the raw data from the memory cells in the memory device. When the error rate is classified to be in a low category, the memory sub-system uses a low power ECC decoder and/or skip ECC decoding. When the error rate is classified to be in a high category, the memory sub-system uses a high power ECC decoder. For example, the high power ECC decoder can use not only the hard bit data but also soft bit data in recovering error-free original data being stored in the memory cells. For example, the hard bit data is the encoded data read from the memory cells at optimized, or controller-specified, read voltages; and the soft bit data is the encoded data read at voltages having predetermined offsets from the optimized, or controller-specified read voltages.

For example, counts measured by calibration circuitry and/or its associated data can be used as the signal and noise characteristics for the predictive model. Further, such signal and noise characteristics can be measured for sub-regions in parallel to reduce the total time for measuring the signal and noise characteristics.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 130,140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative- and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 150) for media management within the same memory device package. An example of a managed memory device is a managed NAND (MNAND) device.

The controller 115 can include a data integrity classifier 113 that can use the signal and noise characteristics measured by the memory components 130 for memory cells to classify, predict, estimate, or determine the degree of error rate in raw data retrieved from the memory cells. In some embodiments, the controller 115 in the memory sub-system 110 includes at least a portion of the data integrity classifier 113. In other embodiments, or in combination, the controller 116 and/or the processing device 118 in the host system 120 includes at least a portion of the data integrity classifier 113. For example, the controller 115, the controller 116, and/or the processing device 118 can include logic circuitry implementing the data integrity classifier 113. For example, the controller 115, or the processing device 118 (processor) of the host system 120, can be configured to execute instructions stored in memory for performing the operations of the data integrity classifier 113 described herein. In some embodiments, the data integrity classifier 113 is implemented in an integrated circuit chip disposed in the memory sub-system 110. In other embodiments, the data integrity classifier 113 can be part of firmware of the memory sub-system 110, an operating system of the host system 120, a device driver, or an application, or any combination therein.

The data integrity classifier 113 can receive signal and noise characteristics measured and provided by a memory device 130 for the memory cells in the memory device 130 and process the signal and noise characteristics to generate a classification that is indicative of the level of errors in the raw data retrieved from memory cells in the memory device 130. Based on the classification, the controller 115 can dynamically adjust the error detection and recovery operations to improve the performance of the memory sub-system 110 (e.g., with reduced power consumption, and/or reduced latency in read operations).

Figure 2:
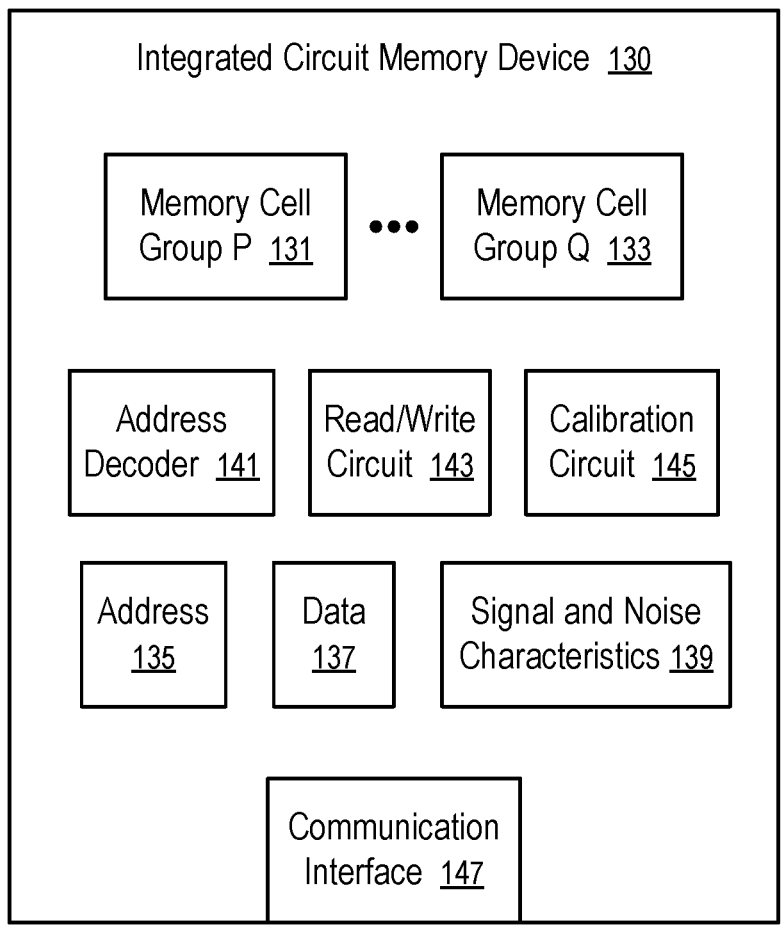
FIG. 2 illustrates an integrated circuit memory device having a calibration circuit configured to measure signal and noise characteristics according to one embodiment.

FIG. 2 illustrates an integrated circuit memory device 130 having a calibration circuit 145 configured to measure signal and noise characteristics according to one embodiment. For example, the memory devices 130 in the memory sub-system 110 of FIG. 1 can be implemented using the integrated circuit memory device 130 of FIG. 2.

The integrated circuit memory device 130 can be enclosed in a single integrated circuit package. The integrated circuit memory device 130 includes multiple groups 131, . . . , 133 of memory cells that can be formed in one or more integrated circuit dies. A typical memory cell in a group 131, . . . , 133 can be programmed to store one or more bits of data.

Some of the memory cells in the integrated circuit memory device 130 can be configured to be operated together for a particular type of operations. For example, memory cells on an integrated circuit die can be organized in planes, blocks, and pages. A plane contains multiple blocks; a block contains multiple pages; and a page can have multiple strings of memory cells. For example, an integrated circuit die can be the smallest unit that can independently execute commands or report status; identical, concurrent operations can be executed in parallel on multiple planes in an integrated circuit die; a block can be the smallest unit to perform an erase operation; and a page can be the smallest unit to perform a data program operation (to write data into memory cells). Each string has its memory cells connected to a common bitline; and the control gates of the memory cells at the same positions in the strings in a block or page are connected to a common wordline. Control signals can be applied to wordlines and bitlines to address the individual memory cells.

The integrated circuit memory device 130 has a communication interface 147 to receive an address 135 from the controller 115 of a memory sub-system 110 and to provide the data 137 retrieved from the memory address 135. An address decoder 141 of the integrated circuit memory device 130 converts the address 135 into control signals to select the memory cells in the integrated circuit memory device 130; and a read/write circuit 143 of the integrated circuit memory device 130 performs operations to determine data stored in the addressed memory cells or to program the memory cells to have states corresponding to storing the data 137.

The integrated circuit memory device 130 has a calibration circuit 145 configured to determine measurements of signal and noise characteristics 139 of memory cells in a group (e.g., 131, . . . , or 133) and provide the signal and noise characteristics 139 to the controller 115 of a memory sub-system 110 via the communication interface 147.

In at least some embodiments, the calibration circuit 145 also provides, to the controller 115 via the communication interface 147, the signal and noise characteristics 139 measured to determine the read level offset value. In some embodiments, the read level offset value can be used to understand, quantify, or estimate the signal and noise characteristics 139. In other embodiments, the statistics of memory cells in a group or region that has a particular state at one or more test voltages can be provided as the signal and noise characteristics 139.

For example, the calibration circuit 145 can measure the signal and noise characteristics 139 by reading different responses from the memory cells in a group (e.g., 131, . . . , 133) by varying operating parameters used to read the memory cells, such as the voltage(s) applied during an operation to read data from memory cells.

For example, the calibration circuit 145 can measure the signal and noise characteristics 139 on the fly when executing a command to read the data 137 from the address 135. Since the signal and noise characteristics 139 is measured as part of the operation to read the data 137 from the address 135, the signal and noise characteristics 139 can be provided from the integrated circuit memory device 130 to the controller 115 with reduced or no penalty on the latency in the execution of the command to read the data 137 from the address 135.

The data integrity classifier 113 of the controller 115 of the memory sub-system 110 is configured to use the signal and noise characteristics 139 to generate an error rate classification of the data 137.

For example, the data integrity classifier 113 can use a predictive model, trained via machine learning, to predict the likelihood of the data 137 retrieved from a group of memory cells (e.g., 131 or 133) failing a test of data integrity. For example, when the data 137 fails to decode, it fails the test of data integrity. The prediction can be actually made based on the signal and noise characteristics 139. Before the test is made using error-correcting code (ECC) and/or low-density parity-check (LDPC) code, or even before the data 137 is transferred to a decoder, the data integrity classifier 113 uses the signal and noise characteristics 139 to predict the result of the test. Based on the predicted result of the test, an optimized operation can be selected and performed for error detection and/or recovery with reduced power consumption and/or latency.

For example, based on the predicted result, one of several conditional paths for the processing of the data 137 can be taken.

For example, in one conditional path, when the data 137 is classified in a category of likely to fail the test (e.g., for having a high error rate), the data 137 can be discarded; and the memory device 130 can be instructed to retry reading the data 137 from the address with a further optimized read voltage.

For example, in another conditional path, when the data 137 is classified in a category of likely to pass the test (e.g., for having a low error rate), the data 137 can be passed to a decoder that uses the hard bit data to provide the original data that is encoded to be stored in the memory device 130.

For example, in further conditional path, when the data 137 is classified in a category of likely to need soft bit data to pass the test (e.g., for having a middle error rate), the data 137 can be passed to a decoder that uses both the hard bit data and the soft bit data to recover the original data that is encoded to be stored in the memory device 130. If the soft bit data is not already available, the memory device 130 can be instructed to read the soft bit data to supplement the data 137 for the decoder.

Thus, when the predictive model predicts a failure, the memory sub-system 110 can initiate the read retry or read calibration without having to wait for the completion of the ECC and/or LDPC operations; and the memory sub-system 110 can skip the transfer of the data to be coded, skip the decoding operation, and/or abort the ongoing decoding operation. As a result, the overall performance of the memory sub-system 110 is improved.

The predictive model can be configured to use the signal and noise characteristics 139 of a memory cell group (e.g., 131 or 133) measured by the calibration circuit 145 during the read operation performed on the memory cell group (e.g., 131 or 133). For example, the predictive model can be pre-trained using data collected from similar memory devices and optionally further trained in the field for the memory sub-system via reinforcement learning based on the results of ECC and/or LDPC operations. For example, when the prediction result is different from the actual test result generated from ECC and/or LDPC operations, a reinforcement learning technique can be applied to train the predictive model to generate a prediction that matches with the actual test result.

Optionally, the predictive model and/or the data integrity classifier 113 can be configured on the memory device 130. When an ECC and/or LDPC failure is predicted, the memory device 130 can suggest read-retry to the controller 115 and predictively initiate the read retry without having to wait for a confirmation from the controller 115. Such a predictive operation to initiate the read retry can reduce the latency of read retry and improve the performance of the memory sub-system 110.

In general, the data integrity classifier 113 can be implemented in the controller 115 and/or the memory devices 130. The prediction generated by the data integrity classifier 113 based on signal and noise characteristics can be used to initiate various processing paths where each path can be configured as an atomic operation. For example, a read-retry can be executed immediately be prior to another command occupying the die in which the memory cell group (e.g., 131 or 133) is formed.

For example, based on the signal and noise characteristics 139, the data integrity classifier 113 can use its predictive model to classify the bit error rate in the retrieved raw data 137 as low, medium, or high. If the classified bit error rate is low, the raw data 137 can be transferred to an LDPC decoder that operates on hard bit data. Such an LDPC decoder has relatively low complexity and correction capability. In some implementations, multiple decoders can be provided to decode the hard bit data without using soft bit data; the decoders can have different correction capabilities and power consumptions; and the classified bit error rate can be further used to select one of the decoders that is likely to be successful in decoding the hard bit data with least power consumption. If the classified bit error rate is medium, the memory device 130 can immediately start to read the soft bit data; and another LDPC decoder that operates on hard bit data and soft bit data can be used.

If the classified bit error rate is high, the memory device 130 can immediately start to read-retry, and/or automatic read calibration with a read of both hard bit data and soft bit data to use an LDPC decoder that has relatively high complexity and correction capability.

In some embodiments, the data integrity classifier 113 generates not only a classification of the bit error rate of the data 137 but also a confidence level indicator of the classification being correct. The confidence level indicator can also be used in the selection of a path from multiple conditional processing paths.

Figure 3:
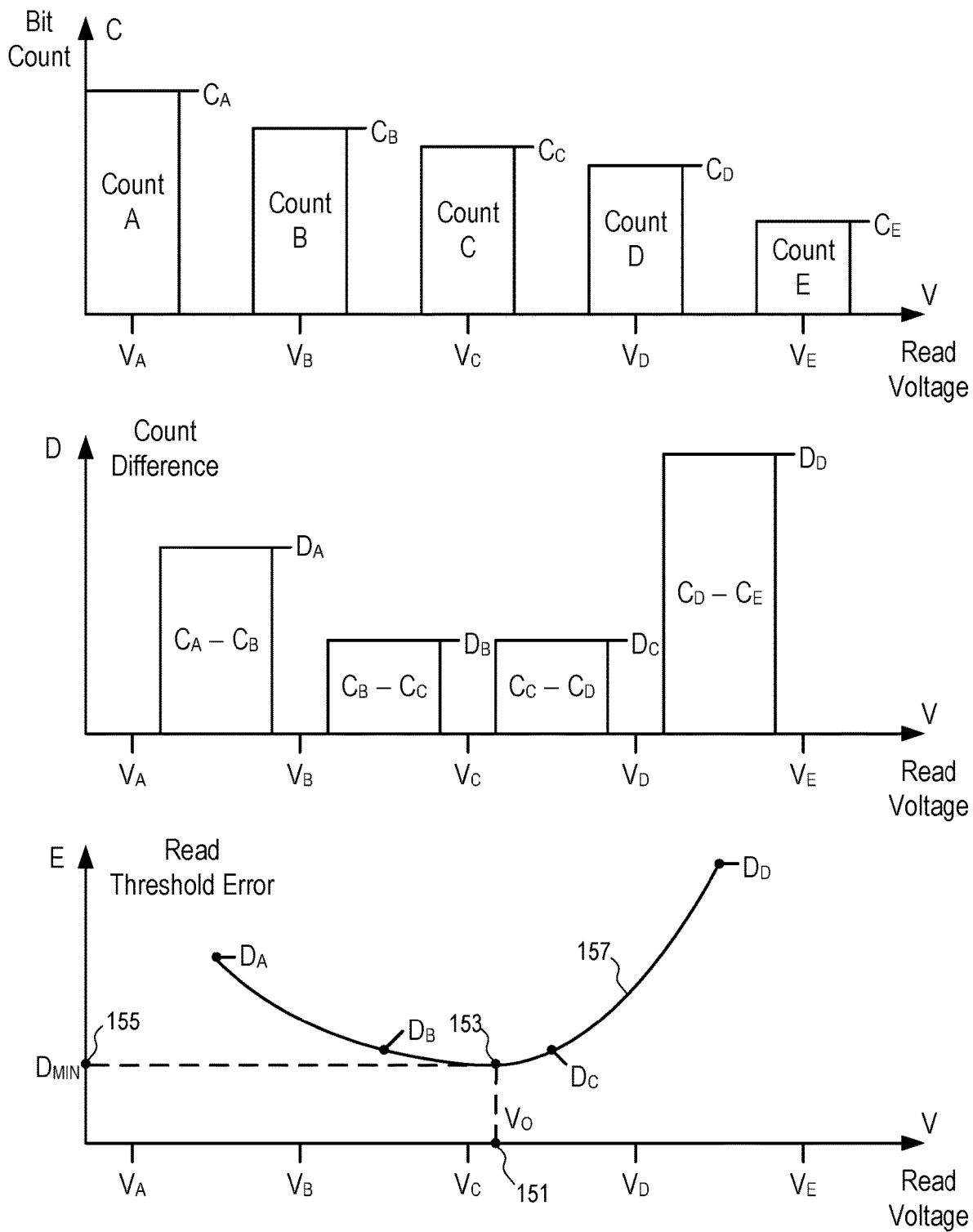
FIG. 3 shows an example of measuring signal and noise characteristics to improve memory operations according to one embodiment.

FIG. 3 shows an example of measuring signal and noise characteristics 139 to improve memory operations according to one embodiment.

In FIG. 3, the calibration circuit 145 applies different read voltages $V_A$, $V_B$, $V_C$, $V_D$, and $V_E$ to read the states of memory cells in a group (e.g., 131, . . . , or 133). In general, more or less read voltages can be used to generate the signal and noise characteristics 139.

As a result of the different voltages applied during the read operation, a same memory cell in the group (e.g., 131, . . . , or 133) may show different states. Thus, the counts $C_A$, $C_B$, $C_C$, $C_D$, and $C_E$ of memory cells having a predetermined state at different read voltages $V_A$, $V_B$, $V_C$, $V_D$, and $V_E$ can be different in general. The predetermined state can be a state of having substantial current passing through the memory cells, or a state of having no substantial current passing through the memory cells. The counts $C_A$, $C_B$, $C_C$, $C_D$, and $C_E$ can be referred to as bit counts.

The calibration circuit 145 can measure the bit counts by applying the read voltages $V_A$, $V_B$, $V_C$, $V_D$, and $V_E$ one at a time on the group (e.g., 131, . . . , or 133) of memory cells. Alternatively, the group (e.g., 131, . . . , or 133) of memory cells can be configured as multiple subgroups; and the calibration circuit 145 can measure the bit counts of the subgroups in parallel by applying the read voltages $V_A$, $V_B$, $V_C$, $V_D$, and $V_E$. The bit counts of the subgroups are considered as representative of the bit counts in the entire group (e.g., 131, . . . , or 133). Thus, the time duration of obtaining the counts $C_A$, $C_B$, $C_C$, $C_D$, and $C_E$ can be reduced.

In some embodiments, the bit counts $C_A$, $C_B$, $C_C$, $C_D$, and $C_E$ are measured during the execution of a command to read the data 137 from the address 135 that is mapped to one or more memory cells in the group (e.g., 131, . . . , or 133). Thus, the controller 115 does not need to send a separate command to request for the signal and noise characteristics 139 that is based on the bit counts $C_A$, $C_B$, $C_C$, $C_D$, and $C_E$.

The differences between the bit counts of the adjacent voltages are indicative of the errors in reading the states of the memory cells in the group (e.g., 133, . . . , or 133).

For example, the count difference $D_A$ is calculated from $C_A$–$C_B$, which is an indication of read threshold error introduced by changing the read voltage from $V_A$ to $V_B$.

Similarly, $D_B = C_B - C_C$; $D_C = C_C - C_D$; and $D_D = C_D - C_E$.

The curve 157, obtained based on the count differences $D_A$, $D_B$, $D_C$, and $D_D$, represents the prediction of read threshold error E as a function of the read voltage. From the curve 157 (and/or the count differences), the optimized read voltage $V_O$ can be calculated as the point 153 that provides the lowest read threshold error $D_{MIN}$ on the curve 157.

In one embodiment, the calibration circuit 145 computes the optimized read voltage $V_O$ and causes the read/write circuit 143 to read the data 137 from the address 135 using the optimized read voltage $V_O$.

Alternatively, the calibration circuit 145 can provide, via the communication interface 147 to the controller 115 of the memory sub-system 110, the count differences $D_A$, $D_B$, $D_C$, and $D_D$ and/or the optimized read voltage $V_O$ calculated by the calibration circuit 145.

FIG. 3 illustrates an example of generating a set of statistical data (e.g., bit counts and/or count differences) for reading at an optimized read voltage $V_O$. In general, a group of memory cells can be configured to store more than one bit in a memory cell; and multiple read voltages are used to read the data stored in the memory cells. A set of statistical data can be similarly measured for each of the read voltages to identify the corresponding optimize read voltage, where the test voltages in each set of statistical data are configured in the vicinity of the expected location of the corresponding optimized read voltage. Thus, the signal and noise characteristics 139 measured for a memory cell group (e.g., 131 or 133) can include multiple sets of statistical data measured for the multiple threshold voltages respectively.

For example, the controller 115 can instruct the memory device 130 to perform a read operation by providing an address 135 and at least one read control parameter. For example, the read control parameter can be a suggested read voltage.

The memory device 130 can perform the read operation by determining the states of memory cells at the address 135 at a read voltage and provide the data 137 according to the determined states.

During the read operation, the calibration circuit 145 of the memory device 130 generates the signal and noise characteristics 139. The data 137 and the signal and noise characteristics 139 are provided from the memory device 130 to the controller 115 as a response. Alternatively, the processing of the signal and noise characteristics 139 can be performed at least in part using logic circuitry configured in the memory device 130. For example, the data integrity classifier 113 can be implemented partially or entirely using the processing logic configured in the memory device 130. For example, the processing logic can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

The signal and noise characteristics 139 can be determined based at least in part on the read control parameter. For example, when the read control parameter is a suggested read voltage for reading the memory cells at the address 135, the calibration circuit 145 can compute the read voltages $V_A$, $V_B$, $V_C$, $V_D$, and $V_E$ that are in the vicinity of the suggested read voltage.

The signal and noise characteristics 139 can include the bit counts $C_A$, $C_B$, $C_C$, $C_D$, and $C_E$. Alternatively, or in combination, the signal and noise characteristics 139 can include the count differences $D_A$, $D_B$, $D_C$, and $D_D$.

Optionally, the calibration circuit 145 uses one method to compute an optimized read voltage $V_O$ from the count differences $D_A$, $D_B$, $D_C$, and $D_D$; and the controller 115 uses another different method to compute the optimized read voltage $V_O$ from the signal and noise characteristics 139 and optionally other data that is not available to the calibration circuit 145.

When the calibration circuit 145 can compute the optimized read voltage $V_O$ from the count differences $D_A$, $D_B$, $D_C$, and $D_D$ generated during the read operation, the signal and noise characteristics can optionally include the optimized read voltage $V_O$. Further, the memory device 130 can use the optimized read voltage $V_O$ in determining the hard bit data in the data 137 from the memory cells at the address 135. The soft bit data in the data 137 can be obtained by reading the memory cells with read voltages that are a predetermined offset away from the optimized read voltage $V_O$. Alternatively, the memory device 130 uses the controller-specified read voltage provided in the read control parameter in reading the data 137.

The controller 115 can be configured with more processing power than the calibration circuit 145 of the integrated circuit memory device 130. Further, the controller 115 can have other signal and noise characteristics applicable to the memory cells in the group (e.g., 133, . . . , or 133). Thus, in general, the controller 115 can compute a more accurate estimation of the optimized read voltage $V_O$ (e.g., for a subsequent read operation, or for a retry of the read operation).

In general, it is not necessary for the calibration circuit 145 to provide the signal and noise characteristics 139 in the form of a distribution of bit counts over a set of read voltages, or in the form of a distribution of count differences over a set of read voltages. For example, the calibration circuit 145 can provide the optimized read voltage $V_O$ calculated by the calibration circuit 145, as signal and noise characteristics 139.

The calibration circuit 145 can be configured to generate the signal and noise characteristics 139 (e.g., the bit counts, or bit count differences) as a byproduct of a read operation. The generation of the signal and noise characteristics 139 can be implemented in the integrated circuit memory device 130 with little or no impact on the latency of the read operation in comparison with a typical read without the generation of the signal and noise characteristics 139. Thus, the calibration circuit 145 can determine signal and noise characteristics 139 efficiently as a byproduct of performing a read operation according to a command from the controller 115 of the memory sub-system 110.

In general, the calculation of the optimized read voltage VO can be performed within the memory device 130, or by a controller 115 of the memory sub-system 110 that receives the signal and noise characteristics 139 as part of enriched status response from the memory device 130.

Figure 4:
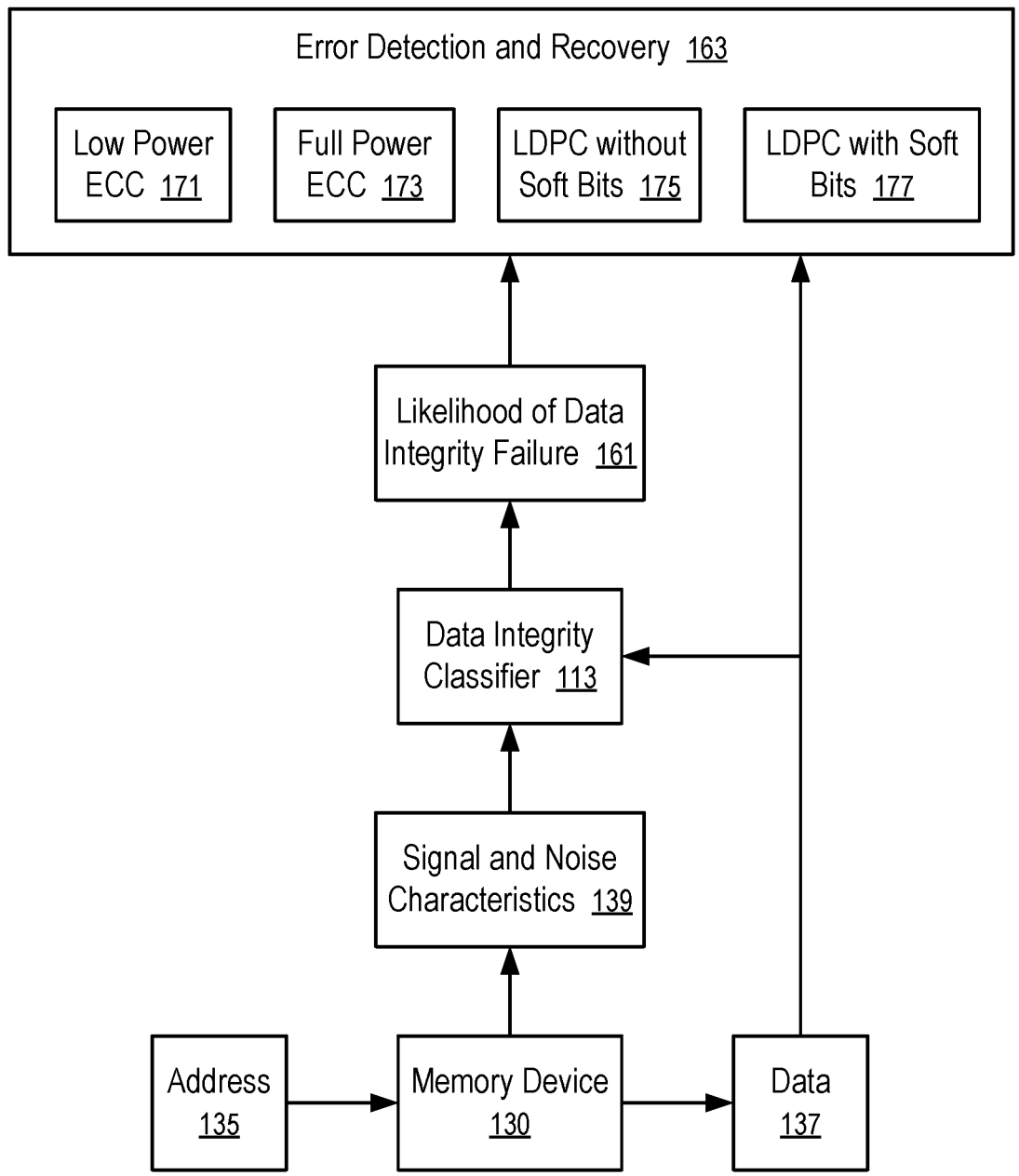
FIG. 4 illustrates a data integrity classifier determining the likelihood of data integrity failure in data retrieved from a memory device to dynamically configure the operations of error detection and recovery for the data according to one embodiment.

FIG. 4 illustrates a data integrity classifier 113 determining the likelihood of data integrity failure in data retrieved from a memory device to dynamically configure the operations of error detection and recovery for the data according to one embodiment. For example, the data integrity classifier 113 can be implemented in the controller 115 of the memory sub-system 110 of FIG. 1, or in an integrated circuit memory device 130 of FIG. 2, using the signal and noise characteristics 139 measured according to FIG. 3.

In FIG. 4, when a memory device 130 receives an address 135 to retrieve data 137 from its memory cells, the memory device 130 measures signal and noise characteristics 139 associated with the data 137. For example, the calibration circuit 145 of the memory device 130 can generate statistics, such as bit counts, count differences, and/or results derived from the statistics, such as the optimize read voltage, in a way as illustrated in FIG. 3.

The data 137 retrieved from the memory cells of the memory device is in an encoded format that allows error detection and recovery 163 (e.g., using techniques such as Error Correction Code (ECC), Low-Density Parity-Check (LDPC) code). The signal and noise characteristics 139 can be provided as input to a data integrity classifier 113 to evaluate the likelihood of the data 137 having too many errors for success decoding the data 137 by some or all the processing paths/modules/options in error detection and recovery 163.

For example, the memory sub-system 110 can include a low power ECC 171, a full power ECC 173, an LDPC decoder 175 that does not use soft bit data, an LDPC decoder 177 that uses both hard bit data and soft bit data in decoding. In general, available paths/modules/options for decoding the data 137 in a memory sub-system 110 are not limited to the examples (e.g., 171, 173, 175, 177) illustrated in FIG. 4; different processing paths/modules/options (e.g., 171, 173, 175, 177) can be implemented; and the different processing paths/modules/options (e.g., 171, 173, 175, 177) have different power consumption levels, different capabilities in recovering error-free original/non-encoded data from the retrieve raw data 137, and/or different processing latency.

The data integrity classifier 113 can be trained (e.g., through machine learning) to predict the likelihood 161 of data integrity failure of the data 137 based on the associated signal and noise characteristics 139.

For example, the likelihood 161 of data integrity failure of the data 137 can be in the form of an estimated bit error rate in the data 137.

For example, the likelihood 161 of data integrity failure of the data 137 can be in the form of a prediction of whether the data 137 can be successfully decoded (e.g., via ECC or LDPC) by any of the processing paths/modules/options (e.g., 171, 173, 175, 177) and if so, which of the processing paths/modules/options (e.g., 171, 173, 175, 177) is or are predicted to be able to successfully decode the data 137 having the associated signal and noise characteristics 139.

Based on the predicted likelihood 161 of data integrity failure of the data 137, the memory sub-system 110 can select one of the processing paths/modules/options (e.g., 171, 173, 175, 177) with reduced power consumption, reduced processing latency, and/or a high probability of success in decoding.

In some embodiments, the data integrity classifier 113 is trained to directly provide a prediction of an optimized processing path/module (e.g., 171, 173, 175, or 177) to process the encoded data 137 retrieved from the memory cells of the memory device 130.

In some embodiments, the data integrity classifier 113 is trained to provide a prediction of a prioritized list of processing paths/modules/options (e.g., 171, 173, 175, and/or 177) that can successfully decode the encoded data 137. Further, the data integrity classifier 113 can further provide an indication of the confidence levels of the selected listed processing paths/modules/options (e.g., 171, 173, 175, and/or 177) in successfully decoding the data 137.

Optionally, the data integrity classifier 113 can also be trained to evaluate the confidence levels of the prediction(s); and the confidence levels can be used in the selection of an option from the available paths/modules/options (e.g., 171, 173, 175, and/or 177) for the processing of the encoded data 137 received from the memory cells in the memory device 130.

In general, the data integrity classifier 113 can be implemented in the memory device 130 and/or in the controller 115 of the memory sub-system 110. For example, one data integrity classifier 113 can be implemented in the memory device 130 and customized for operation decisions to be made in the memory device 130; and another data integrity classifier 113 can be implemented in the controller 115 and customized for operation decisions to be made in the controller 115. For example, the data integrity classifier 113 implemented in the controller 115 can use not only the signal and noise characteristics 139 received from the memory device 130 for the data 137 but also other information that may not be available in the memory device 130, such as charge loss, read disturb, cross-temperature effect, program/erase, data retention, etc. For example, the data integrity classifier 113 implemented in the controller 115 and the data integrity classifier 113 implemented in the memory device 130 can have different complexity, and/or different levels of accuracy in their predictions. Optionally, the memory device 130 provides its prediction 161 to the controller 115 as part of enriched status report for retrieving the data 137; and the controller 115 uses the prediction 161 generated by the memory device 130 to select a path/module/option for decoding the data 137. In some embodiments, the error detection and recovery 163 (or some of the paths/modules/options) are implemented in the memory device 130. For example, the processing logic of the error detection and recovery 163 and the data integrity classifier 113 can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

For example, when the data integrity classifier 113 is implemented in the memory device 130, the output of the data integrity classifier 113 can be used in controlling the retrieval of the data 137.

For example, when the output of the data integrity classifier 113 indicates that the encoded data 137 is likely to be decoded using a decoder (e.g., 177) that uses soft bit data, the memory device 130 can automatically further read the soft bit data in addition to reading the hard bit data. However, if the data integrity classifier 113 indicates that the encoded data 137 can be decoded using a decoder (e.g., 175) that does not require soft bit data as input, the memory device 130 can skip the operations to read soft bit data and/or the operations to transmit the soft bit data to the controller 115.

For example, when the output of the data integrity classifier 113 indicates that none of the available paths/modules/options (e.g., 171, 173, 175, and/or 177) is likely to be successful in decoding the data 137, the memory device 130 can automatically perform a read-retry to search for an improved read voltage without waiting for a command from the controller 115. Further, the memory device 130 can optionally skip reading the data 137 when the output of the data integrity classifier 113 indicates that none of the available paths/modules/options (e.g., 171, 173, 175, and/or 177) is likely to be successful in decoding the data 137.

Figure 5:
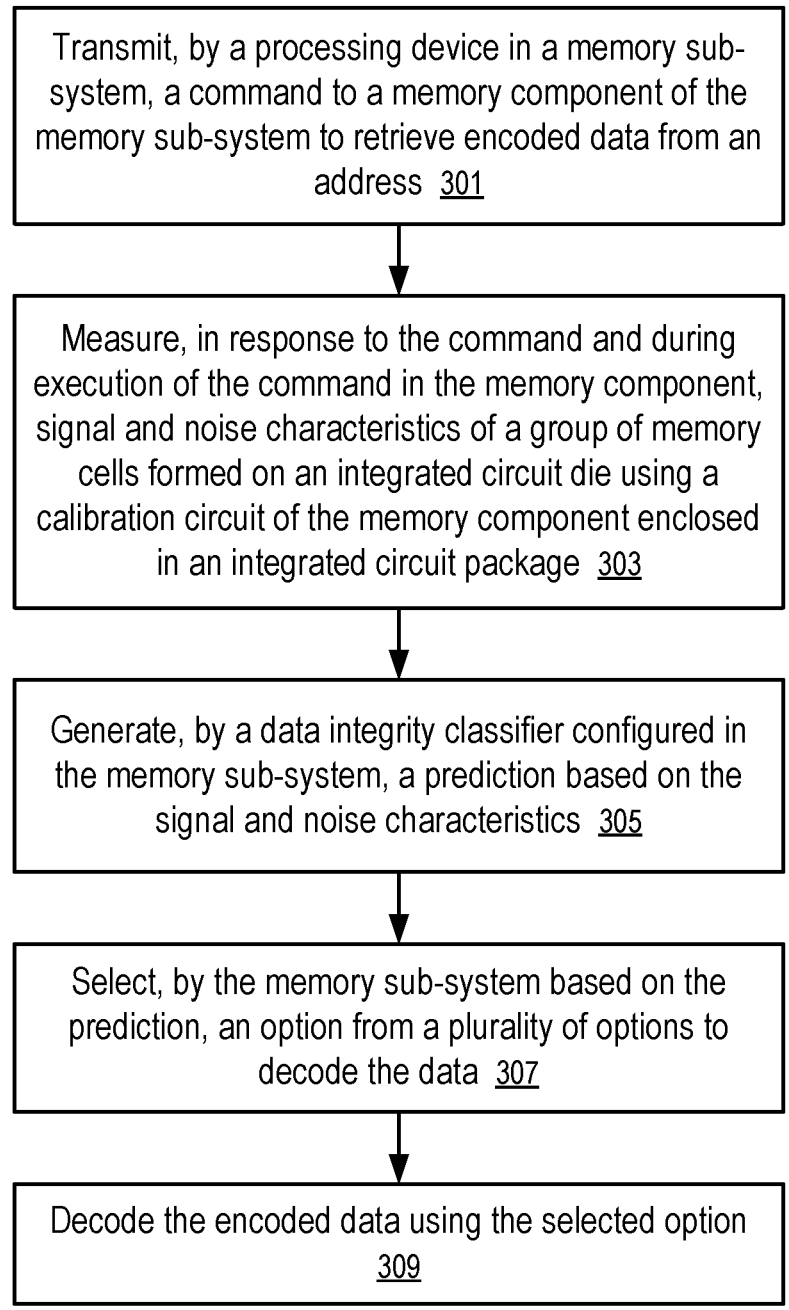
FIG. 5 shows a method of a memory sub-system controlling data integrity operations based on classification of signal and noise characteristics associated with data retrieved from memory cells.

FIG. 5 shows a method of a memory sub-system 110 controlling data integrity operations based on classification of signal and noise characteristics 139 associated with data 137 retrieved from memory cells. The method of FIG. 5 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 5 is performed at least in part by the controller 115 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 5 can be implemented in a computing system of FIG. 1 with a memory device of FIG. 2 and signal noise characteristics illustrated in FIG. 3 with the operations illustrated in FIG. 4.

At block 301, a processing device (e.g., 115) in a memory sub-system 110 transmits a command to a memory device 130 of the memory sub-system 110 to retrieve encoded data 137 from an address 135.

For example, data 137 can be in an encoded form for storing in the memory cells of the memory device 130 for improved reliability. The encoded data 137 has redundancy information, which allows a decoder to detect errors and/or recovery the original data without error when the amount of errors in the retrieved, encoded data 137 is no more than a threshold. For example, the data can be encoded/decoded via an error correction code, or a low-density parity-check code.

At block 303, in response to the command and during execution of the command in the memory device 130, a calibration circuit 145 of the memory device 130 enclosed in an integrated circuit package measures signal and noise characteristics 139 of a group (e.g., 131 or 133) of memory cells formed on an integrated circuit die.

For example, the calibration circuit 145 is formed at least in part on the integrated circuit die, or another integrated circuit die enclosed in the integrated circuit package.

For example, the signal and noise characteristics 139 can include statistical data of memory cells at varying operating parameters, such as different voltages applied to read memory cells in the group (e.g., 131 or 133).

For example, the statistical data can include bit counts (e.g., $C_A$, $C_B$, $C_C$, $C_D$, and/or $C_E$) of memory cells in the group (e.g., 131 or 133) having a predetermined state when the different voltages (e.g., $V_A$, $V_B$, $V_C$, $V_D$, and/or $V_E$) are applied on the group of memory cells. Alternatively, or in combination, the statistical data can include bit differences (e.g., $D_A$, $D_B$, $D_C$, and/or $D_D$), where each bit difference is a difference between a first bit count (e.g., $C_A$) of memory cells in the group having a predetermined state when a first read voltage (e.g., $V_A$) is applied on the group of memory cells, and a second bit count (e.g., $C_B$) of memory cells in the group having the predetermined state when a second read voltage (e.g., $V_B$) is applied on the group of memory cells.

For example, the predetermined state of a memory cell can be a state where the memory cell is substantially conductive (e.g., having a substantially current passing through the memory cell) when a corresponding read voltage is applied on the memory cell. Alternatively, the predetermined state of a memory cell can be a state where the memory cell is substantially non-conductive (e.g., having no substantially current passing through the memory cell) when a corresponding read voltage is applied on the memory cell.

At block 305, a data integrity classifier 113 configured in the memory sub-system 110 generates a prediction (e.g., 181) based on the signal and noise characteristics 139.

At block 307, the memory sub-system 110 selects, based on the prediction, an option from a plurality of options to decode the data 137.

For example, the prediction can be based on machine learning to identify a level of bit error rate in the encoded data 137, to identify the option, and/or to identify a likelihood of an option of failing or succeeding in decoding the encoded data 137 retrieved from the memory device. The prediction can include a confidence level of the prediction.

At block 309, the encoded data is decoded using the selected option.

For example, the plurality of options can include decoders having different levels of complexity, taking different inputs, using different amounts of power in decoding, and/or having different amounts of latency in decoding. The plurality of options can include instructing the memory device 130 to retry read at the address 135 without decoding the encoded data 137, without transmitting the encoded data 137, and/or without reading the data 137 from memory cells in the memory device 130.

For example, the plurality of options can include the use of a first decoder and the use of a second decoder that consumes more energy than the first decoder in operation.

The different decoders can use different amounts of data in their decoding operations. For example, the second decoder (e.g., 177) uses both hard bit data determined from the group of memory cells at read voltages and soft bit data determined from the group of memory cells at voltages having predetermined offsets from the read voltages; and the first decoder (e.g., 175) uses the hard bit data without using the soft bit data.

Optionally, the calibration circuit 145 is configured to compute the read voltages (e.g., $V_O$) for determination of the hard bit data based on the signal and noise characteristics 139. Alternatively, the read voltages for determination of the hard bit data can be calculated and/or specified by the controller 115 of the memory sub-system 110.

A data integrity classifier 113 can be implemented in the controller 115 of the memory sub-system 110 and/or in the memory device 130.

When a data integrity classifier 113 is implemented in the memory device 130, the memory device 130 can determine whether or not to perform the operations to read the soft bit data based on a prediction generated by its data integrity classifier 113.

When a data integrity classifier 113 is implemented via a processing device 117 of the memory sub-system 110, the memory sub-system 110 can be configured to instruct the memory device 130 to perform a read-retry when the prediction indicates a failure of decoders available in the memory sub-system 110 in decoding the encoded data 137, without waiting for the result from a decoder and/or without sending the encoded data to any decoder.

When a data integrity classifier 113 is implemented via a processing device (e.g., 115) of the memory sub-system 110, the memory sub-system 110 can be configured to instruct the memory device 130 to provide the soft bit data when the prediction indicates that the second decoder (e.g., 117) is to be used to decode the encoded data.

The data integrity classifier 113 can include instructions configured as software and/or firmware. For example, the processing device 117 can execute the data integrity classifier 113 to perform the above discussed methods.

A non-transitory computer storage medium can be used to store instructions of the firmware of a memory sub-system (e.g., 110). When the instructions are executed by the controller 115 and/or the processing device 117, the instructions cause the controller 115 and/or the processing device 117 to perform the methods discussed above.

Figure 6:
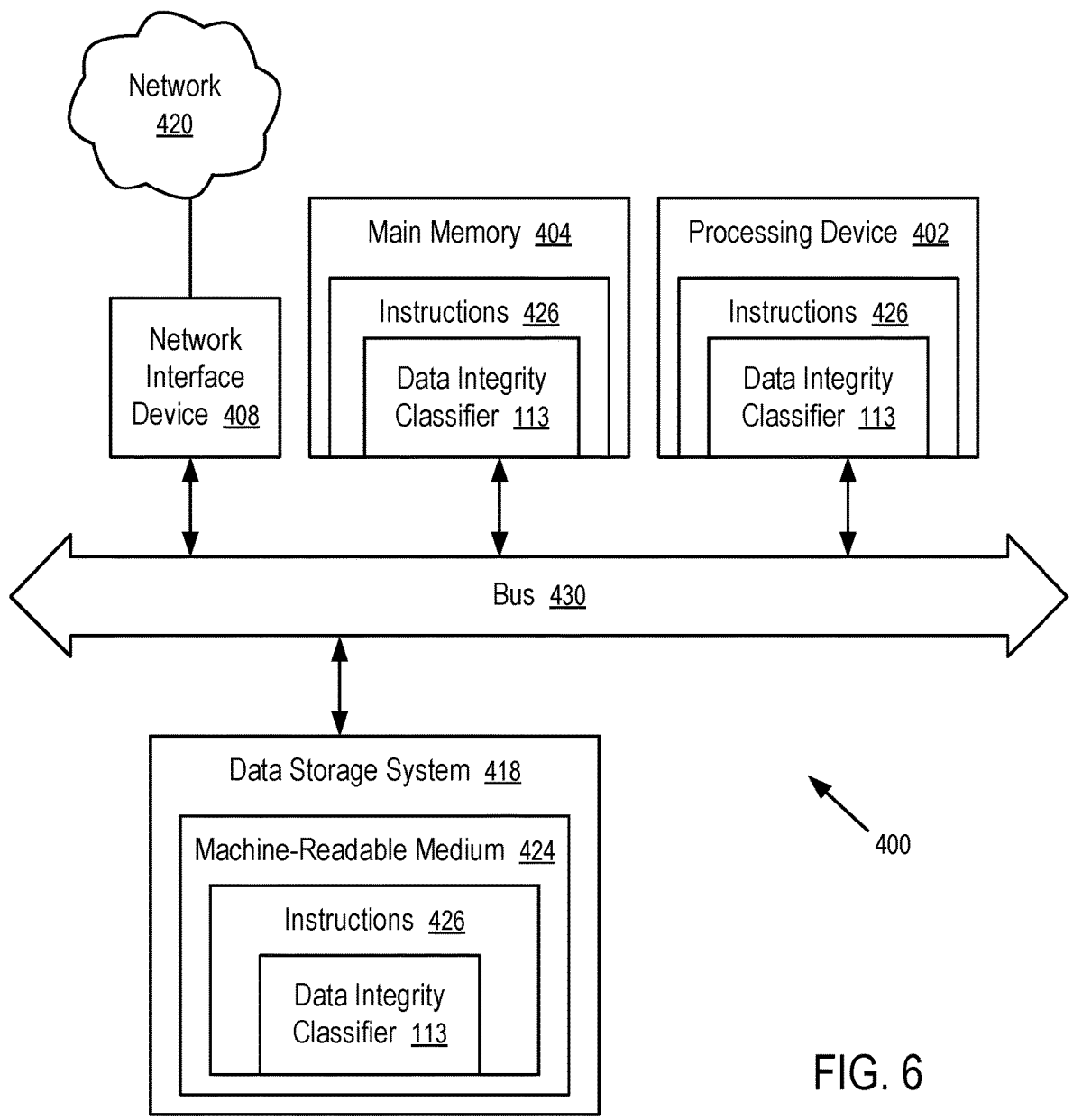
FIG. 6 is a block diagram of an example computer system in which embodiments of the present disclosure can operate.

FIG. 6 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a data integrity classifier 113 (e.g., to execute instructions to perform operations corresponding to the data integrity classifier 113 described with reference to FIGS. 1-5). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a data integrity classifier 113 (e.g., the data integrity classifier 113 described with reference to FIGS. 1-5). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system, comprising:
    a processing device; and
    at least one memory component, the memory component being enclosed in an integrated circuit package, the memory component having:
        a group of memory cells formed on an integrated circuit die; and
        a calibration circuit;
    wherein the processing device is configured to transmit a command to the memory component to retrieve data from an address;
    wherein in response to the command and during execution of the command, the calibration circuit is configured to measure signal and noise characteristics of the group of memory cells associated with encoded data retrieved from the group of memory cells;
    wherein the memory sub-system has a data integrity classifier and a plurality of options available to process the encoded data;
    wherein the data integrity classifier is configured to generate a prediction based on the signal and noise characteristics, wherein the prediction comprises a predicted error rate for decoding the encoded data retrieved during execution of the command; and
    wherein the memory sub-system is configured to select an option from the plurality of options based on the prediction and decode the encoded data using the selected option.

2. The memory sub-system of claim 1, wherein the calibration circuit is formed at least in part on the integrated circuit die.

3. The memory sub-system of claim 2, wherein the signal and noise characteristics include statistic data of memory cells at varying operating parameters.

4. The memory sub-system of claim 3, wherein the varying operating parameters include different voltages applied to read memory cells in the group.

5. The memory sub-system of claim 4, wherein the statistical data includes counts of memory cells in the group having a predetermined state when the different voltages are applied on the group of memory cells.

6. The memory sub-system of claim 4, wherein the statistical data includes count differences, each being a difference between:
    a first count of memory cells in the group having a predetermined state when a first read voltage is applied on the group of memory cells; and
    a second count of memory cells in the group having the predetermined state when a second read voltage is applied on the group of memory cells.

7. The memory sub-system of claim 1, wherein the plurality of options include a first decoder and a second decoder that consumes more energy than the first decoder in operation.

8. The memory sub-system of claim 7, wherein the second decoder uses both hard bit data determined from the group of memory cells at read voltages and soft bit data determined from the group of memory cells at voltages having predetermined offsets from the read voltages; and the first decoder uses the hard bit data without the soft bit data.

9. The memory sub-system of claim 8, wherein the calibration circuit is configured to compute the read voltages for determination of the hard bit data based on the signal and noise characteristics.

10. The memory sub-system of claim 8, wherein the data integrity classifier is implemented in the memory component; and the soft bit data is determined based on the prediction generated by the data integrity classifier.

11. The memory sub-system of claim 8, wherein the data integrity classifier is implemented via the processing device; and the memory sub-system is configured to instruct the memory component to perform a read-retry when the prediction indicates a failure of decoders available in the memory sub-system in decoding the encoded data.

12. The memory sub-system of claim 8, wherein the data integrity classifier is implemented via the processing device; and the memory sub-system is configured to instruct the memory component to provide the soft bit data when the prediction indicates the second decoder is to be used to decode the encoded data.

13. A method, comprising:
    transmitting, by a processing device in a memory sub-system, a command to a memory component of the memory sub-system to retrieve encoded data from an address;
    measuring, in response to the command and during execution of the command in the memory component, signal and noise characteristics of a group of memory cells formed on an integrated circuit die using a calibration circuit of the memory component enclosed in an integrated circuit package;
    generating, by a data integrity classifier configured in the memory sub-system, a prediction based on the signal and noise characteristics, wherein the prediction is generated prior to the encoded data being decoded;
    selecting, by the memory sub-system based on the prediction, an option from the plurality of options; and
    decoding the encoded data using the selected option.

14. The method of claim 13, wherein the signal and noise characteristics include statistics of memory cells in the group read at different levels of voltage.

15. The method of claim 14, wherein the plurality of options include decoders taking different inputs, using different amounts of power in decoding, and having different latency in decoding.

16. The method of claim 15, wherein the prediction is based on machine learning to identify the option.

17. A non-transitory computer storage medium storing instructions which, when executed by a computing system, cause the computing system to perform a method, the method comprising:

transmitting, by a processing device in a memory sub-system, a command to a memory component of the memory sub-system to retrieve encoded data from an address, wherein in response to the command and during execution of the command, a calibration circuit of the memory component measures signal and noise characteristics of a group of memory cells formed on an integrated circuit die;

receiving, from the memory component as a response to the command, the signal and noise characteristics;

generating, by a data integrity classifier configured in the memory sub-system, a prediction based on the signal and noise characteristics, wherein the prediction comprises a prediction that the encoded data will fail a test of data integrity; and selecting, by the memory sub-system based on the prediction, an option from a plurality of options for processing of the encoded data retrieved from the group of memory cells.

18. The non-transitory computer storage medium of claim 17, wherein the plurality of options include decoding the encoded data using different decoders and instructing the memory component to retry-read at the address without decoding the encoded data.

19. The non-transitory computer storage medium of claim 18, wherein the prediction includes a confidence level of the prediction.

20. The non-transitory computer storage medium of claim 19, wherein the decoding is performed using an error correction code, or a low-density parity-check code.

21. The non-transitory computer storage medium of claim 17, wherein the prediction is made before the test of data integrity is actually performed on the encoded data.

22. The non-transitory computer storage medium of claim 17, wherein the prediction is made prior to the encoded data being transferred to a decoder.

23. A non-transitory computer storage medium storing instructions which, when executed by a computing system, cause the computing system to perform a method, the method comprising:

transmitting, by a processing device in a memory sub-system, a first command to a memory component of the memory sub-system to retrieve first encoded data from an address, wherein in response to the first command and during execution of the first command, a calibration circuit of the memory component measures first signal and noise characteristics of a group of memory cells formed on an integrated circuit die using a first set of read level signals;

receiving, from the memory component as a response to the first command, the first signal and noise characteristics;

generating, by a data integrity classifier configured in the memory sub-system, a prediction based on the first signal and noise characteristics;

selecting, by the memory sub-system based on the prediction, an option from a plurality of options for retrying the retrieval of data from the memory component; and transmitting, by the processing device, a second command to the memory component to retrieve second encoded data from the address, wherein in response to the second command and during execution of the second command, the calibration circuit of the memory component measures second signal and noise characteristics of the group of memory cells using a second set of read level signals, wherein the second command to retrieve second encoded data using the second set of read level signals is transmitted prior to any completion of decoding of the first encoded data.

24. The non-transitory computer storage medium of claim 23, wherein the decoding of the first encoded data begins before the second command is transmitted and the decoding of the first encoded data is aborted in response to selecting the option from the plurality of options for retrying the retrieval of data.

25. The non-transitory computer storage medium of claim 23, wherein the decoding of the first encoded data is not started prior to the transmitting of the second command.

* * * * *